(12) United States Patent
Kim et al.

(10) Patent No.: US 12,006,614 B2
(45) Date of Patent: Jun. 11, 2024

(54) CLOTHES CARE APPARATUS

(71) Applicant: Samsung Electronics Co., Ltd., Suwon-si (KR)

(72) Inventors: Hyeon Joo Kim, Suwon-si (KR); Jin Young Choi, Suwon-si (KR); Eung Ryeol Seo, Suwon-si (KR); Sang Jin Kim, Suwon-si (KR); Kyoung-Woong Noh, Suwon-si (KR); Dong Bum Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 575 days.

(21) Appl. No.: 17/250,862

(22) PCT Filed: Sep. 10, 2019

(86) PCT No.: PCT/KR2019/011699
§ 371 (c)(1),
(2) Date: Mar. 12, 2021

(87) PCT Pub. No.: WO2020/055090
PCT Pub. Date: Mar. 19, 2020

(65) Prior Publication Data
US 2022/0042230 A1 Feb. 10, 2022

(30) Foreign Application Priority Data
Sep. 12, 2018 (KR) .................. 10-2018-0109193

(51) Int. Cl.
*D06F 34/08* (2020.01)
*D06F 58/10* (2006.01)
(Continued)

(52) U.S. Cl.
CPC .............. *D06F 34/08* (2020.02); *D06F 58/10* (2013.01); *D06F 58/20* (2013.01); *D06F 73/02* (2013.01); *H05K 7/2039* (2013.01); *H05K 5/0091* (2013.01)

(58) Field of Classification Search
CPC .......... D06F 34/08; D06F 58/10; D06F 58/20; D06F 73/02
See application file for complete search history.

(56) References Cited

U.S. PATENT DOCUMENTS

2007/0205231 A1* 9/2007 Haul ................. D06F 34/08
68/17 R
2013/0091904 A1* 4/2013 Kim ................. D06F 34/34
68/3 R
(Continued)

FOREIGN PATENT DOCUMENTS

JP H0752708 Y2 12/1995
JP H11207085 A 8/1999
(Continued)

OTHER PUBLICATIONS

Electronic translation of KR-20020022986-A to Hong. (Year: 2000).*
(Continued)

*Primary Examiner* — Joseph L. Perrin

(57) ABSTRACT

Disclosed is a clothes care apparatus capable of preventing the spreading of fire when a fire occurs on a printed circuit board (PCB) assembly. The clothes care apparatus may comprise: a PCB assembly; a PCB housing having an accommodation space for accommodating the PCB assembly, the PCB housing including a sidewall that forms the accommodation space; and a protective body filled into the accommodation space to cover the PCB assembly, wherein
(Continued)

the sidewall may include guide wall having a height lower than or equal to a height of the protective body filled in the accommodation space.

11 Claims, 8 Drawing Sheets

(51) Int. Cl.
*D06F 58/20* (2006.01)
*D06F 73/02* (2006.01)
*H05K 7/20* (2006.01)
*H05K 5/00* (2006.01)

(56) References Cited

U.S. PATENT DOCUMENTS

2014/0298865 A1\* 10/2014 Park ..................... D06F 34/28
   68/12.02
2017/0280575 A1\* 9/2017 Kim ..................... H05K 1/02

FOREIGN PATENT DOCUMENTS

| JP | 2013-143992 A | | 7/2013 |
|----|---------------|---|--------|
| KR | 0135932 Y1 | * | 5/1996 |
| KR | 10-2000-0013747 A | | 3/2000 |
| KR | 20020020330 A | * | 9/2000 |
| KR | 20020022986 A | * | 9/2000 |
| KR | 10-2003-0026132 A | | 3/2003 |
| KR | 10-2014-0120784 A | | 10/2014 |
| KR | 101457090 B1 | | 10/2014 |
| KR | 10-2016-0052177 A | | 5/2016 |

OTHER PUBLICATIONS

Electronic translation of KR-20020020330-A to Hong. (Year: 2000).\*
Electronic translation of KR-0135932-Y1 to Kim . (Year: 1996).\*
International Search Report and Written Opinion of the International Searching Authority in connection with International Application No. PCT/KR2019/011699 dated Jan. 30, 2020, 13 pages.
Korean Office Action dated Jul. 12, 2023, in connection with Korean Patent Application No. 10-2018-0109193, 10 pages.

\* cited by examiner

CLOTHES CARE APPARATUS

CROSS-REFERENCE TO RELATED APPLICATIONS

This application is a 371 National Stage of International Application No. PCT/KR2019/011699, filed Sep. 10, 2019, which claims priority to Korean Patent Application No. 10-2018-0109193, filed Sep. 12, 2018, the disclosures of which are herein incorporated by reference in their entirety.

BACKGROUND

1. Field

The disclosure relates to a clothes care apparatus capable of preventing a fire from spreading outside the clothes care apparatus when a fire occurs in a printed circuit board assembly.

2. Description of Related Art

A clothes care apparatus is an apparatus that performs the clothes care, such as drying wet clothes, removing dust stuck to clothes or odor permeated into clothes, and reducing creases of clothes.

The clothes care apparatus includes a body provided with a clothes care compartment in which clothes are accommodated and treated, and a door for opening and closing the clothes care compartment. Inside the body, a compressor and a heat exchanger for supplying dry air to clothes are provided, and a steam generator for supplying steam to clothes is provided. In addition, a printed circuit board (PCB) assembly for controlling various devices of the clothes care apparatus is provided inside the body.

The clothes care apparatus involves vibration during operation and uses water to generate steam. A protective body using a polymer, such as urethane, may be used to protect the PCB assembly provided inside the clothes care apparatus from moisture and vibration. The protective body may be injected in a liquid state and then cured to protect the PCB assembly.

A fire may occur in the PCB assembly due to poor contact with a connector. When a fire breaks out in the PCB assembly, the protective body melts to become a liquid, and may catch fire. When the protective body is stuck in one place, the fire may continue to grow. When the protective body catching fire is discharged to the outside of the clothes care apparatus, the fire may spread outside the clothes care apparatus.

SUMMARY

Therefore, it is an object of the disclosure to provide a clothes care apparatus capable of preventing a fire generated from a PCB assembly from spreading to the outside of a clothes care apparatus.

It is another aspect of the disclosure to provide a clothes care apparatus capable of preventing the protective body that protects a PCB assembly from being discharged to the outside of the clothes care apparatus when a fire occurs in the PCB assembly.

In accordance with an aspect of the disclosure, a clothes care apparatus includes a printed circuit board (PCB) assembly; a PCB housing having an accommodation space for accommodating the PCB assembly, the PCB housing including a sidewall that forms the accommodation space; and a protective body filled into the accommodation space to cover the PCB assembly, wherein the sidewall may include a guide wall having a height lower than or equal to a height of the protective body filled in the accommodation space.

The guide wall may be disposed below the PCB assembly.

The clothes care apparatus may further include a housing cover to which the PCB housing is coupled, and a machine room cover coupled to the housing cover to accommodate the PCB together with the housing cover, the machine room cover including an air inlet.

The clothes care apparatus may further include a lower cover provided to prevent the protective body from being discharged to an outside of the machine room cover through the air inlet when the protective body is melted.

The lower cover and the housing cover may form a flow path provided to guide the protective body when the protective body is melted.

The flow path may guide the protective body to a cover hole provided at a lower portion of the housing cover.

The clothes care apparatus may include a wire disposed between the PCB housing and the housing cover, and an upper cover provided to accommodate the wire together with the PCB housing and the housing cover.

The PCB assembly may include a heat generating body, and the guide wall may be disposed adjacent to the heat generating body.

The heat generating body may include a relay switch and a connector.

The PCB assembly further may include a heat sink provided to absorb heat of the heat generating body, and the heat sink may be disposed above the heat generating body adjacent to the heat generating body.

The sidewall may include a hole provided to discharge the protective body to the outside of the PCB housing when the protective body is melted.

The PCB assembly may be disposed to face the machine room cover.

The PCB assembly may include a PCB, and the protective body may cover entire regions of the PCB to prevent moisture from penetrating into the PCB.

As is apparent from the above, the disclosure can provide a clothes care apparatus that prevents a fire generated in a PCB assembly from spreading to the outside of a clothes care apparatus.

Further, the disclosure can provide a clothes care apparatus that prevents the protective body that protects the PCB assembly from being discharged to the outside of the clothes care apparatus when a fire occurs in a PCB assembly.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
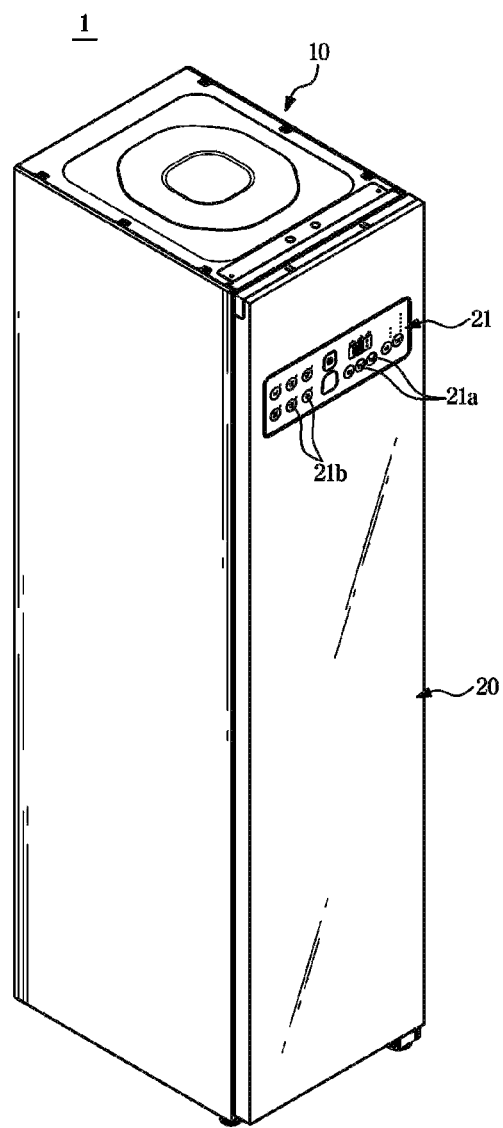
FIG. 1 is a perspective view illustrating a clothes care apparatus according to an embodiment of the disclosure.

Embodiments described in the disclosure and configurations shown in the drawings are merely examples of the embodiments of the disclosure, and may be modified in various different ways at the time of filing of the present application to replace the embodiments and drawings of the disclosure.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the disclosure, a first element may be termed as a second element, and a second element may be termed as a first element.

Hereinafter, embodiments according to the disclosure will be described in detail with reference to the accompanying drawings.

Figure 2:
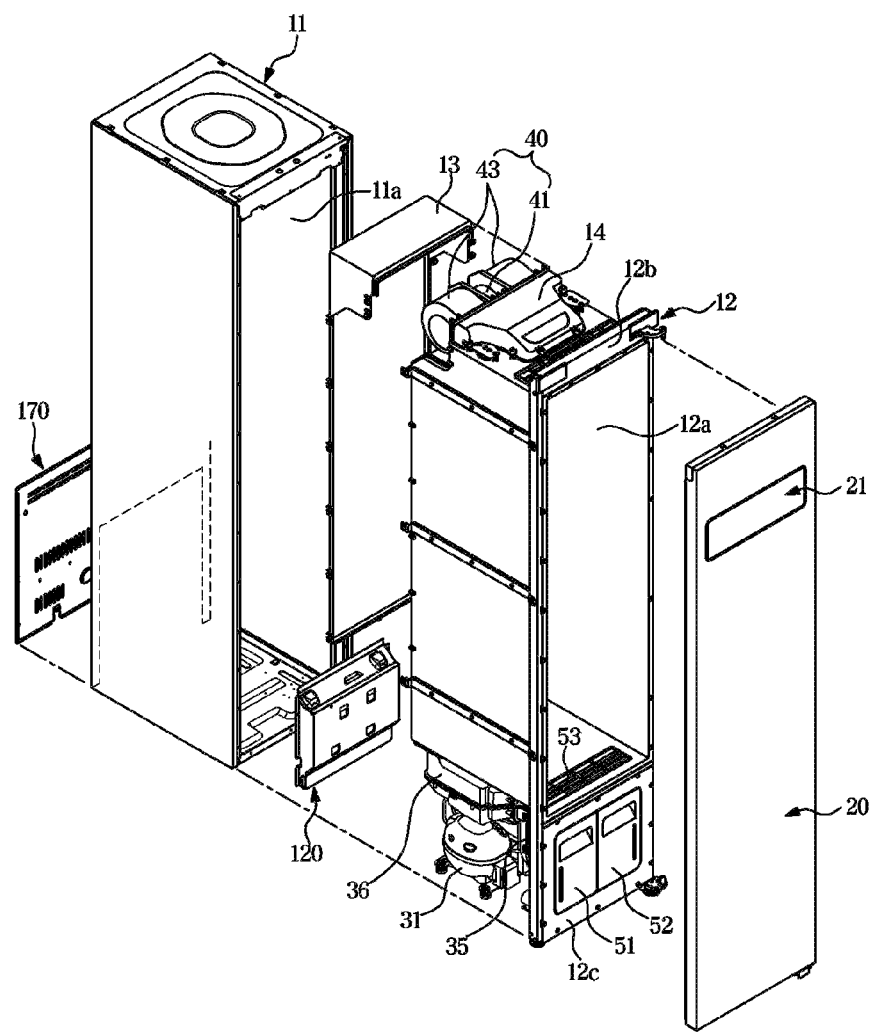
FIG. 2 is an exploded perspective view illustrating the clothes care apparatus according to the embodiment of the disclosure.
Figure 3:
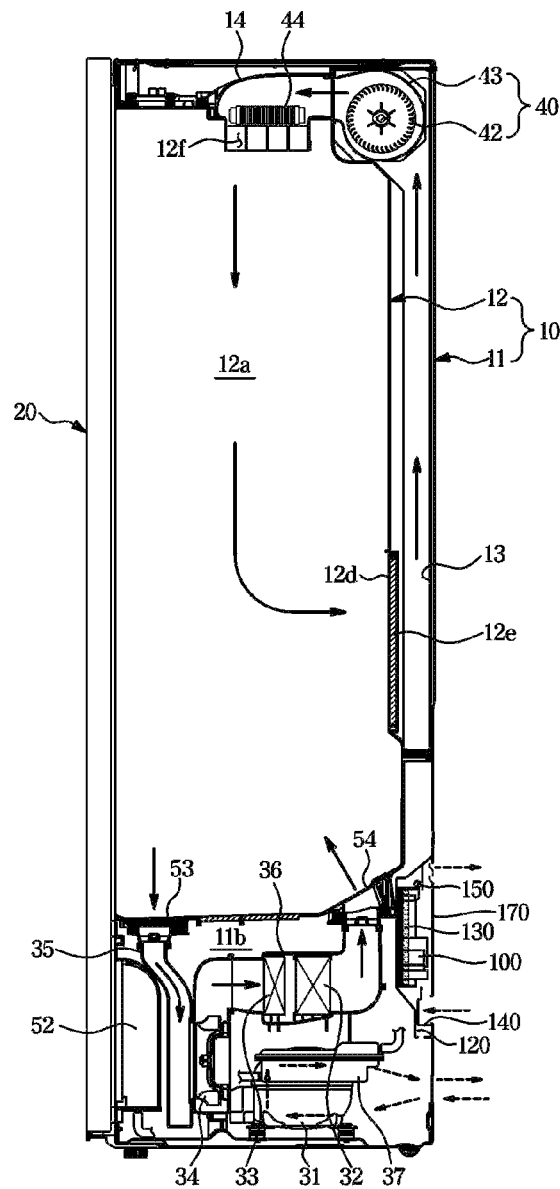
FIG. 3 is a side cross-sectional view illustrating the clothes care apparatus according to the embodiment of the disclosure.
Figure 4:
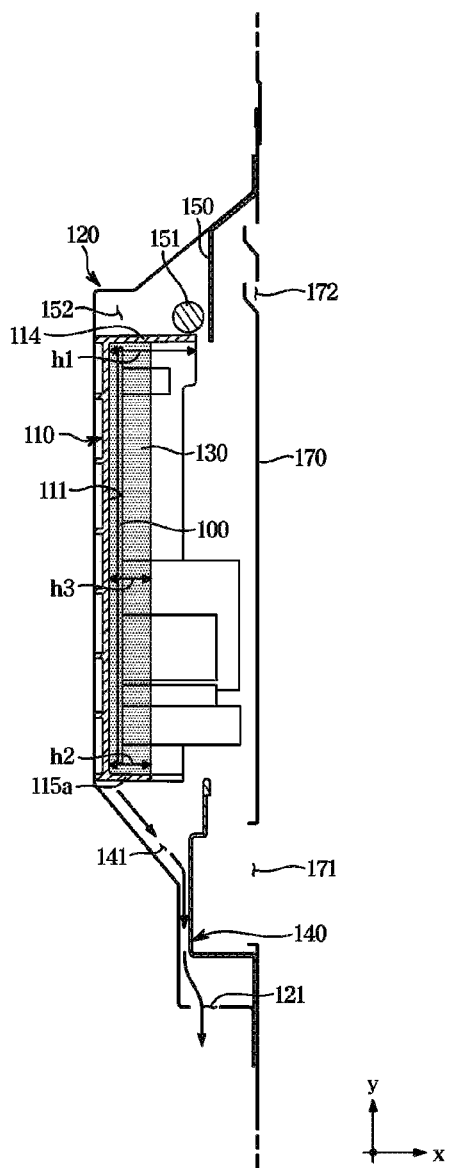
FIG. 4 is an enlarged view illustrating a part of FIG. 3.

FIG. 1 is a perspective view of a clothes care apparatus according to an embodiment of the disclosure. FIG. 2 is an exploded perspective view of a clothes care apparatus according to an embodiment of the disclosure. FIG. 3 is a side cross-sectional view of a clothes care apparatus according to an embodiment of the disclosure. FIG. 4 is an enlarged view illustrating a part of FIG. 3.

As shown in FIGS. 1 and 2, a clothes care apparatus may include a body 10, a clothes care compartment 12a provided inside the body 10 to accommodate and manage clothing, and a door 20 rotatably coupled to the body 10 to open and close the clothes care compartment 12a.

The body 10 may include an outer frame 11, an inner frame 12 disposed inside the outer frame 11, and upper ducts 13 and 14 disposed between the outer frame 11 and the inner frame 12 to guide air to circulate the air.

The outer frame 11 may be provided in a rectangular parallelepiped shape having a front surface opened to have an inner space 11a.

The inner frame 12 may be disposed in the inner space 11a of the outer frame 11. The inner frame 12 may be disposed in the inner space 11a to partition a machine room 11b. The inner frame 12 may include the clothes care compartment 12a having a front surface open and configured to accommodate clothes.

The machine room 11b may correspond to a part of the inner space 11a and may be separated from the clothes care compartment 12a by the inner frame 12. The machine room 11b may be disposed under the clothes care compartment 12a and have a rear side thereof opened. The open rear side of the machine room 11b may be covered by a machine room cover 170.

As shown in FIG. 3, the machine room 11b may accommodate a compressor 31, heat exchangers 32 and 33, and an expansion valve (not shown) constituting a refrigeration cycle. The heat exchangers 32 and 33 may include a condenser 32 and an evaporator 33.

The machine room 11b may accommodate a lower fan 34 provided to suck air into the machine room 11b and lower ducts 35 and 36 provided to guide the air sucked by the lower fan 34. The machine room 11b may accommodate a steam generating device 37 provided to generate steam. Also, the machine room 11b may accommodate a PCB assembly 100 provided to control various parts of the clothes care apparatus 1.

The door 20 may be rotatably installed on one side of the front surface of the body 10. The door 20 may rotate to open and close the clothes care compartment 12a.

The door 20 may include a control panel 21 provided to allow a user to select an operation of the clothes care apparatus 1. The control panel 21 may be disposed on the front surface of the door. The control panel 21 may include a button 21a provided to allow a user to select an operation of the clothes care apparatus 1 by being touched or pushed by the user, and a display portion 21b provided to display an operation status of the clothes care apparatus 1. Alternatively, the control panel 21 may be provided as a display portion capable of performing a touch input without distinguishing buttons from a display.

The front surface of the outer frame 11 may be opened and thus the outer frame 11 may accommodate the inner frame 12 through the open front surface. A lower part of a rear surface of the outer frame 11 may be opened. In other words, the rear side of the machine room 11b may be opened. As described above, the open rear side of the machine room 11b may be covered by machine room cover 170. Particularly, the machine room cover 170 may be coupled to the rear lower side of the outer frame 11 to cover the open rear side of the machine room 11b. The machine room cover 170 may form a rear wall of the machine room 11b.

The inner frame 12 may include the clothes care compartment 12a having a front surface opened, an upper cover portion 12b forming a space, in which a blower 40 is accommodated, at an upper side of the clothes care compartment 12a, and a lower cover portion 12c provided to extend downward from a front lower end of the clothes care compartment 12a and cover the front of the machine room 11b.

The blower 40 may be disposed behind the upper cover portion 12b. The blower 40 may include a driving motor 41 provided to generate a rotational force, a pair of upper fans 42 provided to be rotated by the driving motor 41, and a pair of fan cases 43 provided to accommodate the pair of upper fans 42.

A shaft of the driving motor 41 may protrude toward opposite sides and thus the upper fans 42 may be coupled to opposite ends of the shaft, respectively. With this structure, the pair of upper fans 42 may be rotated by the single driving motor 41.

The pair of upper fans 42 may be provided as a centrifugal fan that suctions air in the axial direction and discharges air radially outward, but is not limited thereto.

A water supply tank 51 and a water drain tank 52 may be detachably installed on the lower cover portion 12c. The water supply tank 51 and the water drain tank 52 may be individually separated from the lower cover portion 12c. The water supply tank 51 and the water drain tank 52 may be individually coupled to the lower cover 12c. The water supply tank 51 may supply water to the steam generator 37. The water drain tank 52 may store water that is condensed in a process of humid air passing through the refrigeration cycle. The position of the water supply tank and water drain tank may vary.

Referring to FIG. 3, a first inlet 12d provided to allow the air in the clothes care compartment 12a to flow into the upper ducts 13 and 14 may be provided at the rear surface of the clothes care compartment 12a. A filter 12e provided to collect foreign matter, such as dust, may be provided on the front or rear side of the first inlet 12d. The filter 12e may include a High Efficiency Particulate Air (HEPA) filter, but is not limited thereto.

A first outlet 12f provided to discharge air of the upper ducts 13 and 14 to the clothes care compartment 12a may be provided on the upper surface of the clothes care compartment 12a.

When the upper fan 42 rotates, the air inside the clothes care compartment 12a may flow into the first upper duct 13 through the first inlet 12d. Foreign matter such as fine dust may be removed by the filter 12e when the air in the clothes care compartment 12a flows into the first upper duct 13. The air flowing into the first upper duct 13 may be moved upward along the first upper duct 13 and suctioned into the upper fan 42. Air discharged from the upper fan 42 may be moved along the second upper duct 14 and discharged into the clothes care compartment 12a through the first outlet 12f provided on the upper surface of the clothes care compartment 12a. A heater 44 provided to heat air may be installed inside the second upper duct 14. By passing through the heater 44, hot air may be discharged into the clothes care compartment 12a through the first outlet 12f.

Referring to FIG. 3, a second inlet 53 and a second outlet 54 may be provided on the upper surface of the machine room 11b. The second inlet 53 may be disposed on the lower front side of the clothes care compartment 12a and the second outlet 54 may be disposed on the lower rear side of the clothes care compartment 12a. The arrangement of the second inlet and the second outlet may vary.

Air inside the clothes care compartment 12a may flow into the first lower duct 35 through the second inlet 53. One end of the first lower duct 35 may be connected to the second inlet 53 and the other end of the first lower duct 35 may be connected to the lower fan 34. The air flowing into the first lower duct 35 may be moved to the second lower duct 36 through the lower fan 34.

The evaporator 33 and the condenser 32 may be arranged inside the second lower duct 35. The evaporator 33 may absorb heat from the air of the second lower duct 35. The moisture in the air may be condensed by passing through the evaporator 33, and the condensed water may be stored in the water drain tank 52 through a predetermined path. The humidity of the air passing through the evaporator 33 is lowered.

The condenser 32 may be installed on the downstream side of the evaporator 33 in the air flow path. The air having lowered humidity by passing through the evaporator 33 is heated by passing through the condenser 32. After passing through the evaporator 33 and the condenser 32, the temperature of the air becomes higher and the humidity of the air becomes lower. The hot and humid air may be discharged to the clothes care compartment 12a through the second outlet 54.

As mentioned above, the air inside the clothes care compartment 12a may be introduced into the second inlet 53 and pass through the refrigeration cycle and then the air may be discharged through the second outlet 54. By using the process, it is possible to dehumidify the inside of the clothes care compartment 12a and to dry clothes.

The machine room 11b may accommodate the compressor 31, the steam generator 37, and the PCB assembly 100.

According to an embodiment of the disclosure, the compressor 31 may be an inverter compressor capable of changing the rotation speed or the compression capacity. The inverter compressor is capable of changing the compression capacity through the rotation speed control, thereby controlling heat output of the condenser 32. The inverter compressor may use DC power as a power source. Therefore, an inverter circuit is used to convert AC power to DC power and obtain a target frequency.

According to an embodiment of the disclosure, the PCB assembly 100 may include an inverter circuit. The inverter circuit may include an intelligent power module (IPM) and a bridge diode, which are provided to control the compressor 31. The inverter circuit may further include a heat sink 105 for cooling the IPM and the bridge diode.

The compressor 31, the steam generator 37, and the PCB assembly 100 each generate heat during operation. Particularly, the PCB assembly 100 including the inverter circuit has the highest heat output, and the PCB assembly 100 is most vulnerable to heat.

Referring to FIGS. 3 and 4, the PCB assembly 100 may be cooled in a space separated from the compressor 31 and the steam generator 37, which are heat generating bodies. Particularly, the PCB assembly 100 may be accommodated in a space formed between the housing cover 120 and the machine room cover 170. The housing cover 120 may prevent heat generated from the compressor 31 and the steam generator 37 from being transferred to the PCB assembly 100.

The machine room cover 170 may include an air inlet 171 provided on the lower side of the machine room cover 170 and allowing air outside of the clothes care apparatus 1 to admit and an air outlet 172 provided on the upper side of the machine room cover 170 and discharging the air heat exchanged with the PCB assembly 100.

Since the air introduced through the air inlet 171 does not move to the machine room 11b but is discharged to the air outlet 172, the PCB assembly 100 may be cooled independently in a space separated from the machine room 11b. Accordingly, cooling efficiency of the PCB assembly 100 may be improved.

Referring to FIG. 4, the PCB assembly 100 may be disposed to face the machine room cover 170. More particularly, a mounting surface of the PCB assembly 100 may be disposed to face the machine room cover 170. In other words, the PCB assembly 100 may be disposed substantially perpendicular to the ground.

A PCB housing 110 may be provided to accommodate the PCB assembly 100. In addition, the PCB housing 110 may be provided to accommodate a protective body 130 that protects the PCB assembly 100 from moisture penetration and vibration. The PCB housing 110 may be provided in a rectangular parallelepiped shape with one open surface.

The protective body 130 may be accommodated in the PCB housing 110 and may protect the PCB assembly 100. The protective body 130 may include a polymer such as urethane. The protective body 130 may be filled into the PCB housing 110 after the PCB assembly 100 is coupled to the PCB housing 110. The protective body 130 may be filled into the PCB housing 110 in a liquid state and then cured into a solid.

The PCB assembly 100 may include a PCB on which various devices are mounted. The protective body 130 may be provided to cover over entire regions of the PCB. The protective body 130 may be provided to cover whole surface of the PCB. The protective body 130 may prevent moisture from penetrating into the PCB or prevent devices mounted on the printed circuit board from being separated by vibration.

The PCB assembly 100 may include a connector and a relay switch. The relay switch may be connected to the steam generator 37, and the connector may be connected to the compressor 31. Since the steam generator 37 and the compressor 31 have relatively high power consumption, when a contact failure occurs at the connector or relay switch or a contact point is overheated, a fire may occur in the PCB assembly 100.

When a fire occurs in the PCB assembly 100, the solid protective body 130 may be melted to become a liquid by heat. The protective body 130 is formed of a flame-retardant material such as urethane, but may be burned when a high-temperature heating source is present and continuously exposed to the high-temperature heating source. When the protective body 130 is burned and the protective body 130 is accommodated in the PCB housing 110, the fire may continue to grow since the heating source, the protective body 130, which is an inflammable material, and oxygen exist. Therefore, the protective body 130 in a liquid state needs to be discharged from the PCB housing 110 in order to prevent the spread of fire.

In addition, when the protective body 130 is burned in a liquid state, and the protective body 130 is discharged to the outside of the clothes care apparatus 1, the fire may spread outside of clothes care apparatus 1. Therefore, the protective body 130 in a liquid state needs to be prevented from being discharged to the outside of the clothes care apparatus 1 in order to prevent the spread of fire to the outside of the clothes care apparatus 1.

In accordance with an aspect of the disclosure, when a fire occurs in the PCB assembly 100, the clothes care apparatus 1 may discharge the protective body 130 downward of the PCB housing 110.

In addition, in accordance with an aspect of the disclosure, when a fire occurs in the PCB assembly 100, the clothes care apparatus 1 may prevent the protective body 130 from being discharged to the outside of the clothes care apparatus 1.

The height of at least a portion of sidewalls of the PCB housing 110 may be equal to or lower than the height of the protective body 130.

Figure 6:
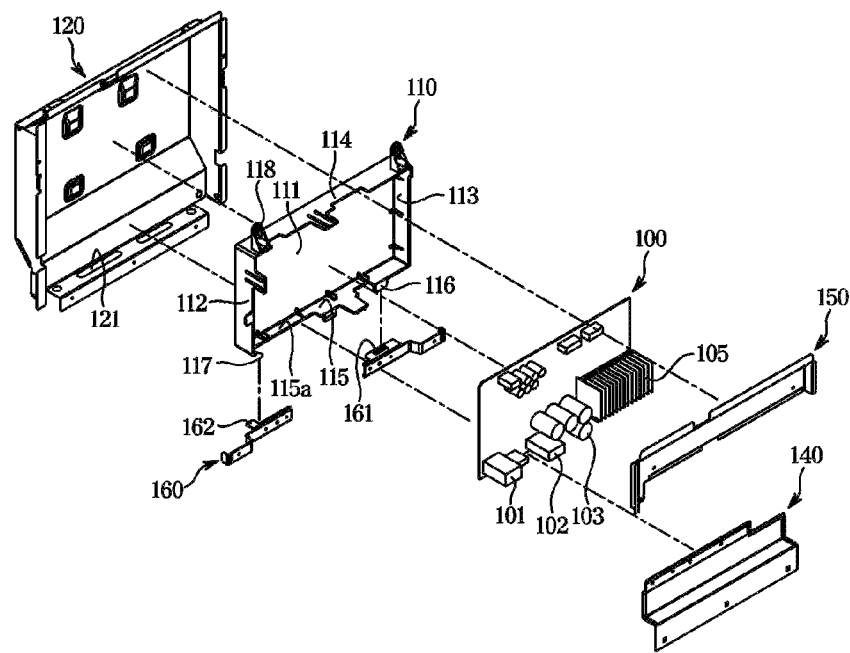
FIG. 6 is an exploded perspective view illustrating the part shown in FIG. 5.

The PCB housing 110 may include a bottom surface 111 forming an accommodation space for accommodating the PCB assembly 100 and the protective body 130, and sidewalls (112, 113, 114, and 115 in FIG. 6).

Based on FIG. 4, the sidewall disposed at the upper side of the PCB housing 110 is referred to as an upper sidewall 114, and the sidewall disposed at the lower side of the PCB housing 110 is referred to as a guide wall 115a. In addition, in FIG. 4, the height of the sidewalls may refer to the length of the sidewalls in the x-axis direction. In addition, in FIG. 4, the height of the guide wall may refer to the length of the guide wall in the x-axis direction. In addition, in FIG. 4, the height of the protective body may refer to the length of the protective body in the x-axis direction.

In accordance with an aspect of the disclosure, the height h1 of the upper sidewall 114 may be provided larger than the height h2 of the guide wall 115a. In addition, the height h2 of the guide wall 115a may be equal to or smaller than the height h3 of the protective body 130.

Since the height h2 of the guide wall 115a is equal to or smaller than the height h3 of the protective body 130, the protective body 130 melted in the case of a fire in the PCB assembly 100 may be discharged downward of the PCB housing 110.

When the height h2 of the guide wall 115a is larger than the height h3 of the protective body 130, the protective body 130 that is melted may remain inside the PCB housing 110 without being discharged downward of the PCB housing 110 due to the guide wall 115a. As described above, when the protective body 130, which is an inflammable material, is continuously exposed to the heating source, the fire may grow, so it is preferable to move the protective body 130 downward. Since fire moves from bottom to top, the spread of the fire may be prevented by moving inflammable materials downward of the fire.

In accordance with an aspect of the disclosure, since the height h2 of the guide wall 115a is equal to or smaller than the height h3 of the protective body 130, the melted protective body 130 may be moved downward without being accumulated in the PCB housing 110. When the protective body 130, which is a inflammable material, moves downward through the guide wall 115a having a low height, the protective body 130 does not remain around the heating source, preventing the spread of fire.

One example of a method of lowering the height h2 of the guide wall 115a than the height h3 of the protective body 130 is as follows. The protective body 130 in a liquid state is filled to a predetermined height in the PCB housing 110 and then cured. Thereafter, a portion of the guide wall 115a may be cut so that the height of the guide wall 115a is lower than the height of the protective body 130. Since the protective body 130 is already cured, even when the height of the guide wall 115a is lower than the height of the protective body 130, the protective body 130 is not discharged downward through the lowered guide wall 115a.

Referring to FIG. 4, the clothes care apparatus 1 may include a lower cover 140 provided to prevent the protective body 130 in a liquid state from being discharged to the outside of the clothes care apparatus 1 through the air inlet 171.

The housing cover 120 may include a cover hole 121 provided to discharge the melted protective body 130 into the machine room 11b. The cover hole 121 may be formed to face the bottom surface of the machine room 11b.

The lower cover 140 may prevent the protective body 130 from being discharged to the outside of the clothes care apparatus 1 through the air inlet 171. The lower cover 140 may form a flow path 141 provided to guide the melted protective body 130 together with the housing cover 120.

The flow path 141 may guide the protective body 130 in a liquid state discharged downward from the PCB housing 110. The flow path 141 may guide the melted protective body 130 to the cover hole 121 formed in the housing cover 120. The protective body 130 guided to the cover hole 121 along the flow path 141 may be discharged into the machine room 11b. Since there is no heating source inside the machine room 11b, the protective body 130 in a liquid state may be cooled by external air and cured into a solid. Thus, the spread of fire may be prevented.

The clothes care apparatus 1 may include a wire 151 disposed above the PCB housing 110. The wire 151 may be disposed between the upper sidewall 114 of the PCB housing 110 and the housing cover 120. The wire 151 may be formed of an inflammable material.

As described above, since the fire moves from the bottom to the top, when there is an inflammable material on the top of the heating source, the fire may spread. Therefore, the flammable wire 151 needs to be blocked from fire.

In accordance with an aspect of the disclosure, the clothes care apparatus 1 may include an upper cover 150 provided to block the wire 151 from the heating source. The upper cover 150 may form the inner space 152 together with the upper sidewall 114 and the housing cover 120. The wire 151 may be disposed in the inner space 152. As the wire 151 is disposed in the inner space 152, the wire 151 may be separated from the heating source. Accordingly, even when a fire occurs in the PCB assembly 100, the fire may be not be transferred to the wire 151. Even when the wire 151 catches fire, the fire is trapped in the inner space 152 formed by the housing cover 120, the upper sidewall 114, and the upper cover 150, and the fire does not spread. Thus, it is possible to prevent the spread of fire.

The housing cover 120, the lower cover 140, and the upper cover 150 may be formed of a non-flammable material to prevent the spread of fire, for example, a metal material.

Figure 5:
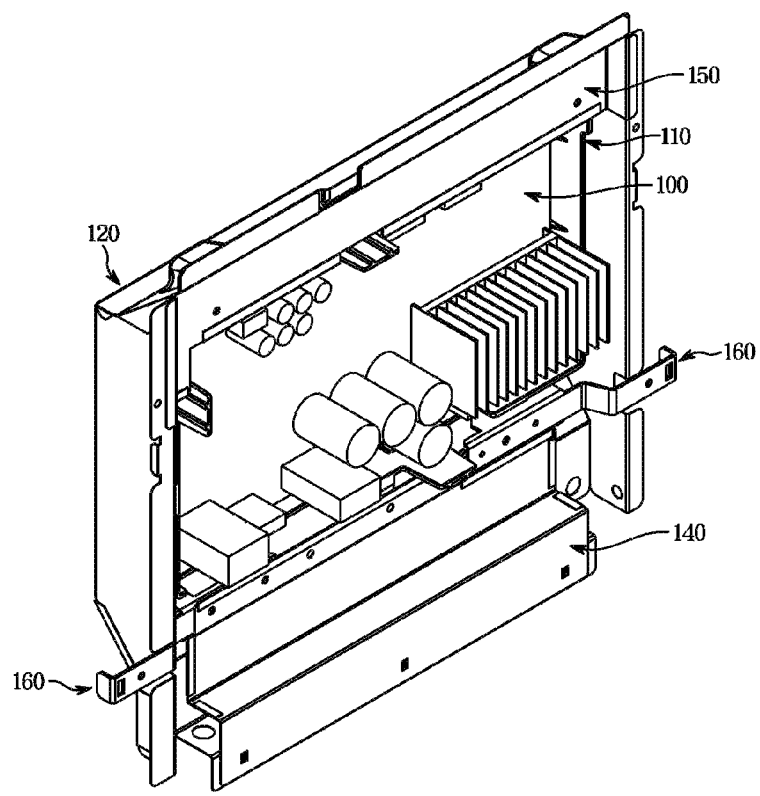
FIG. 5 is a perspective view illustrating a part of the clothes care apparatus according to the embodiment of the disclosure.

FIG. 5 is a perspective view illustrating a part of the clothes care apparatus according to the embodiment of the disclosure. FIG. 6 is an exploded perspective view illustrating the part shown in FIG. 5.

Hereinafter, a coupling relation of the PCB assembly, the PCB housing, and peripheral components, and the structure of each component will be described in detail with reference to FIGS. 5 and 6. The protective body is not shown in FIGS. 5 and 6.

Referring to FIGS. 5 and 6, the PCB housing 110 may be coupled to the housing cover 120. The PCB housing 110 may be coupled to the housing cover 120 through a fastening portion 118.

The PCB housing 110 may be provided in a rectangular parallelepiped shape with one open surface. The PCB housing 110 may include the bottom surface 111 and the sidewalls 112, 113, 114, and 115 provided around the bottom surface 111. The bottom surface 111 and the sidewalls 112, 113, 114, and 115 may form an accommodation space for accommodating the PCB assembly 100 and the protective body 130.

The sidewalls 112, 113, 114, and 115 may include the left sidewall 112, the right sidewall 113, the upper sidewall 114, and the lower sidewall 115. The lower sidewall 115 may include the guide wall 115a having a relatively low height. The guide wall 115a may form a guide groove (115b in FIG. 7). As described above, since the height of the guide wall 115a is provided relatively low, when the protective body 130 is melted, the protective body 130 may pass through the guide wall 115a and move downward of the PCB housing 110.

The PCB housing 110 may include a coupling protrusion 116 protruding downward from the lower sidewall 115 and a support wall 117 formed between the guide wall 115a and the left sidewall 112. The support wall 117 may be part of the lower sidewall 115.

The clothes care apparatus 1 may include a bracket 160 provided to couple the PCB housing 110 to the machine room 11b.

The bracket 160 may include a coupling groove 161 provided to allow the coupling protrusion 116 of the PCB housing 110 to be inserted thereinto, and a support protrusion 162 provided to support the support wall 117 of the PCB housing 110. The bracket 160 may have the same left and right sides for common use of parts. Although not specifically shown in the drawing, the bracket on the left may also include a coupling groove, and the bracket on the right may also include a support protrusion.

The PCB assembly 100 may be accommodated in the PCB housing 110. The PCB assembly 100 may include heat generating bodies 101, 102, 103 and 104 and a heat sink 105.

The heat generating bodies 101, 102, 103 and 104 may include a first heat generating body 101, a second heat generating body 102, a third heat generating body 103, and a fourth heat generating body 104. The heat generating bodies 101, 102, 103 and 104 may include a relay switch or a connector.

The upper cover 150 may be coupled to the upper side of the housing cover 120, and the lower cover 140 may be coupled to the lower side of the housing cover 120.

Figure 7:
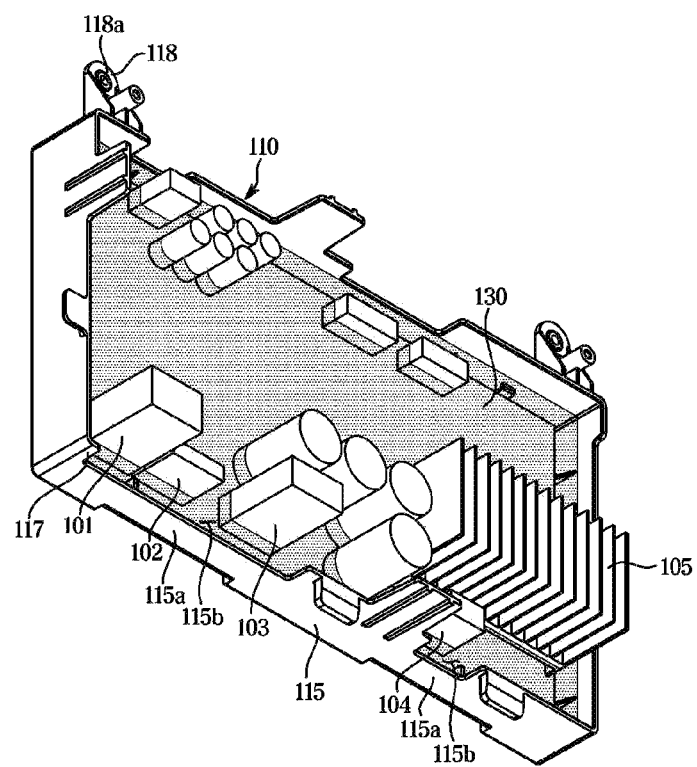
FIG. 7 is a perspective view illustrating a PCB assembly, a PCB housing, and a protective body of the clothes care apparatus according to the embodiment of the disclosure.

FIG. 7 is a perspective view illustrating a PCB assembly, a PCB housing, and a protective body of the clothes care apparatus according to the embodiment of the disclosure.

Referring to FIG. 7, the PCB housing 110 may include the fastening portion 118. The fastening portion 118 may include a fastening hole 118a provided to pass the fastening member (not shown). The fastening member (not shown) may pass through the fastening hole 118a and be fastened to the housing cover 120.

The guide wall 115a and the guide groove 115b may be provided in plural. The guide wall 115a and the guide groove 115b may be formed below the heat generating bodies 101, 102, 103 and 104. This is because there is a high possibility that ignition occurs in the heat generating bodies 101, 102, 103 and 104. When ignition occurs in the heat generating bodies 101, 102, 103 and 104, the protective body 130 around the heat generating body is melted. Therefore, such a configuration allows the melted heat generating body to be discharged downward of the PCB housing 110.

The heat sink 105 may be disposed adjacent to the heat generating bodies 101, 102, 103 and 104. In addition, the heat sink 105 may be disposed above the heat generating bodies 101, 102, 103 and 104. For example, as shown in FIG. 7, the heat sink 105 may be disposed above the fourth heat generating body 104 and be disposed adjacent to the fourth heat generating body 104.

The heat sink 105 is generally formed of a metal material, and the metal material is a type of non-flammable material. Thus, the heat sink 105 may not burn. The fire moves from the bottom to the top, and when the heat sink 105 is disposed above the heat generating bodies 101, 102, 103 and 104, the spread of fire may be prevented. This is because the heat sink 105 has a larger volume than the heat generating body and is formed of a non-flammable material.

As described above, the protective body 130 may maintain a solid state when a fire does not occur in the PCB assembly 100. Therefore, even when the bottom surface 111 of the PCB housing 110 is disposed to face the machine room cover 170, the protective body 130 may not flow downward. However, when a fire occurs in the PCB assembly 100, the protective body 130 is melted and may flow downward through the guide groove 115b.

Figure 8:
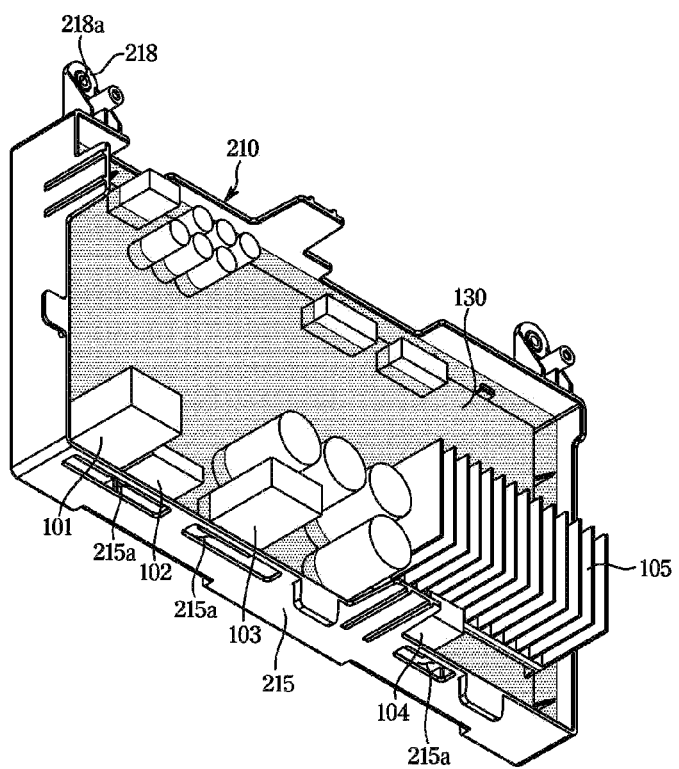
FIG. 8 is a perspective view illustrating a PCB assembly, a PCB housing, and a protective body of a clothes care apparatus according to another embodiment of the disclosure.

FIG. 8 is a perspective view illustrating a PCB assembly, a PCB housing, and a protective body of a clothes care apparatus according to another embodiment of the disclosure.

Hereinafter, other configurations except for the PCB housing 210 are the same as in the above embodiment and the redundant description thereof will be omitted.

Referring to FIG. 8, in the clothes care apparatus according to another embodiment of the disclosure, a PCB housing 210 may include a hole 215a formed in a lower sidewall 215. The hole 215a may be formed below the heat generating bodies 101, 102, 103 and 104. When a fire occurs in the PCB assembly 100, the melted protective body 130 may move downward of the PCB housing 210 through the hole 215a.

While the disclosure has been particularly described with reference to exemplary embodiments, it should be understood by those of skilled in the art that various changes in form and details may be made without departing from the spirit and scope of the disclosure.

The invention claimed is:

1. A clothes care apparatus comprising:
a printed circuit board (PCB) assembly;
a PCB housing having an accommodation space for accommodating the PCB assembly, the PCB housing including a sidewall that forms the accommodation space;
a protective body filled into the accommodation space to cover the PCB assembly;
a housing cover to which the PCB housing is coupled; and
a machine room cover coupled to the housing cover to accommodate the PCB assembly in a space formed between the housing cover and the machine room cover, the machine room cover including an air inlet,
wherein the sidewall includes an upper sidewall disposed at an upper side of the PCB housing and a guide wall disposed at a lower side of the PCB housing, and
wherein the guide wall includes a guide groove configured to discharge the protective body downward of the PCB housing when the protective body is melted.

2. The clothes care apparatus according to claim 1, wherein the guide wall is disposed below the PCB assembly.

3. The clothes care apparatus according to claim 1, further comprising:
a lower cover provided to prevent the protective body from being discharged to an outside of the machine room cover through the air inlet when the protective body is melted.

4. The clothes care apparatus according to claim 3, wherein:
the lower cover and the housing cover form a flow path provided to guide the protective body when the protective body is melted, and
the flow path guides the protective body to a cover hole provided at a lower portion of the housing cover.

5. The clothes care apparatus according to claim 1, further comprising:
a wire disposed between the PCB housing and the housing cover; and
an upper cover provided to accommodate the wire together with the PCB housing and the housing cover.

6. The clothes care apparatus according to claim 1, wherein:
the PCB assembly includes a heat generating body, and
the guide wall is disposed adjacent to the heat generating body.

7. The clothes care apparatus according to claim 6, wherein the heat generating body includes:
a relay switch; and
a connector.

8. The clothes care apparatus according to claim 6, wherein the PCB assembly further comprises:
a heat sink provided to absorb heat of the heat generating body; and
the heat sink is disposed above the heat generating body adjacent to the heat generating body.

9. A clothes care apparatus comprising:
a printed circuit board (PCB) assembly;
a PCB housing having an accommodation space for accommodating the PCB assembly, the PCB housing including a sidewall that forms the accommodation space; and
a protective body filled into the accommodation space to cover the PCB assembly,
a housing cover to which the PCB housing is coupled; and
a machine room cover coupled to the housing cover to accommodate the PCB assembly in a space formed between the housing cover and the machine room cover, the machine room cover including an air inlet,
wherein the sidewall includes:
an upper sidewall disposed at an upper side of the PCB housing;
a guide wall disposed at a lower side of the PCB housing; and
a hole provided to discharge the protective body to an outside of the PCB housing when the protective body is melted.

10. The clothes care apparatus according to claim 1, wherein the PCB assembly is disposed to face the machine room cover.

11. The clothes care apparatus according to claim 1, wherein:
the PCB assembly includes a PCB; and
the protective body covers entire regions of the PCB to prevent moisture from penetrating into the PCB.

* * * * *